United States Patent
Zou

(10) Patent No.: US 10,629,657 B2
(45) Date of Patent: Apr. 21, 2020

(54) OLED DEVICE, BRIGHTNESS ADJUSTMENT METHOD THEREOF AND DISPLAY DEVICE

(71) Applicant: BOE TECHNOLOGY GROUP CO., LTD., Beijing (CN)

(72) Inventor: Xiangxiang Zou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 8 days.

(21) Appl. No.: 15/972,873

(22) Filed: May 7, 2018

(65) Prior Publication Data
US 2019/0067384 A1   Feb. 28, 2019

(30) Foreign Application Priority Data
Aug. 24, 2017   (CN) .......................... 2017 1 0737598

(51) Int. Cl.
*H01L 27/32* (2006.01)
*G09G 3/3208* (2016.01)
(Continued)

(52) U.S. Cl.
CPC ........ *H01L 27/3227* (2013.01); *B81B 3/0083* (2013.01); *G09G 3/3208* (2013.01);
(Continued)

(58) Field of Classification Search
None
See application file for complete search history.

(56) References Cited

U.S. PATENT DOCUMENTS

2009/0066876 A1   3/2009   Woo et al.
2009/0159901 A1   6/2009   Ikeda et al.
(Continued)

FOREIGN PATENT DOCUMENTS

CN   101382453 A   3/2009
CN   101464579 A   6/2009
(Continued)

OTHER PUBLICATIONS

First Chinese Office Action dated Sep. 27, 2018.
Second Chinese Office Action dated May 22, 2019.

*Primary Examiner* — Zandra V Smith
*Assistant Examiner* — Lawrence C Tynes, Jr.
(74) *Attorney, Agent, or Firm* — Dilworth & Barrese, LLP.; Michael J. Musella, Esq.

(57) ABSTRACT

An organic light-emitting diode (OLED) device, a brightness adjustment method thereof and a display device are provided. The OLED device includes: an OLED substrate provided with at least one OLED element; a package structure configured to form a closed space with the OLED substrate; and an external compensation component including at least one photosensitive sensor and at least one compensation adjustment unit. The at least one photosensitive sensor is configured to detect the light intensity emitted by the at least one OLED element; and the at least one compensation adjustment unit is provided on a side wall on a light-emitting side of the package structure facing the closed space and configured to adjust light intensity emitted by the at least one OLED element according to a detected signal by the at least one photosensitive sensor.

10 Claims, 4 Drawing Sheets

(51) Int. Cl.
*H01L 51/52* (2006.01)
*B81B 3/00* (2006.01)

(52) U.S. Cl.
CPC ...... *H01L 27/3232* (2013.01); *H01L 27/3234* (2013.01); *H01L 27/3269* (2013.01); *G09G 2320/0233* (2013.01); *G09G 2320/0626* (2013.01); *G09G 2360/145* (2013.01); *G09G 2360/148* (2013.01); *H01L 51/524* (2013.01)

(56) References Cited

U.S. PATENT DOCUMENTS

2013/0194199 A1* 8/2013 Lynch ................. G06F 3/0412
345/173
2018/0164578 A1 6/2018 Xu

FOREIGN PATENT DOCUMENTS

| CN | 101635276 A | 1/2010 |
|----|-------------|--------|
| CN | 103971629 A | 8/2014 |
| CN | 104991342 A | 10/2015 |
| CN | 105895023 A | 8/2016 |
| CN | 106887212 A | 6/2017 |

* cited by examiner

OLED DEVICE, BRIGHTNESS ADJUSTMENT METHOD THEREOF AND DISPLAY DEVICE

CROSS REFERENCE TO RELATED APPLICATIONS

The application claims priority to the Chinese patent application No. 201710737598.6, filed on Aug. 24, 2017 on SIPO and entitled "Organic Light-emitting Diode (OLED) Device, Brightness Adjustment Method Thereof and Display Device", which is incorporated herein by reference in its entirety.

TECHNICAL FIELD

Embodiments of the present disclosure relate to an organic light-emitting diode (OLED) device, a brightness adjustment method thereof and a display device.

BACKGROUND

An OLED display is a thin-film luminescent device made from organic luminescent materials and driven by a direct voltage. The OLED display technology differs from the LCD display method in that no backlight is needed and the current is used to drive an organic luminescent material film to emit light. Compared to the LCD display, the OLED display can be made lighter and thinner, have a wider viewing angle, and can significantly save electric energy. In the current OLED display, thin-film transistors (TFTs) for controlling pixels may not be uniform or stable, so that the elements in the OLED device may have brightness difference, and the display can be affected.

SUMMARY

Embodiments of the present disclosure provide an organic light-emitting diode (OLED) device, a brightness adjustment method thereof and a display device.

At least one embodiment of the present disclosure provides an organic light-emitting diode (OLED) device, comprising: an OLED substrate provided with at least one OLED element; a package structure configured to form a closed space with the OLED substrate; and an external compensation component including at least one photosensitive sensor and at least one compensation adjustment unit. The at least one photosensitive sensor is configured to detect the light intensity emitted by the at least one OLED element; and the at least one compensation adjustment unit is provided on a side wall on a light-emitting side of the package structure facing the closed space and configured to adjust light intensity emitted by the at least one OLED element according to a detected signal by the at least one photosensitive sensor.

For example, the at least one OLED element is arranged corresponding to the at least one compensation adjustment unit in one-to-one correspondence.

For example, the at least one compensation adjustment unit includes a micro-electro-mechanical system (MEMS) light valve.

For example, the MEMS light valve comprises: a light-shielding plate and a position control unit, in which the position control unit is configured to control the movement of the light-shielding plate, so as to shield at least one part of a light-emitting region of the at least one OLED element.

For example, the at least one photosensitive sensor is provided in an opaque region of the OLED device; a number of the at least one photosensitive sensor is equal to that of the at least one compensation adjustment unit; and the at least one photosensitive sensor includes at least one of PN junction or PIN junction.

For example, the at least one photosensitive sensor is provided on the side wall on the light-emitting side of the package structure facing the closed space and corresponding to the opaque region; or the at least one photosensitive sensor is provided on a region of the OLED substrate corresponding to the opaque region.

For example, the OLED) device further comprises at least one of: a detection unit connected with each of the at least one photosensitive sensor; and a current storage unit connected with the at least one photosensitive sensor.

At least one embodiment of the present disclosure provides a display device, comprising the OLED device.

At least one embodiment of the present disclosure provides a method for adjusting the brightness of an OLED device. The OLED device comprises an OLED substrate provided with at least one OLED element; a package structure configured to form a closed space with the OLED substrate; and an external compensation component including at least one photosensitive sensor and at least one compensation adjustment unit; and the method comprises: detecting light intensity emitted by the at least one OLED element by the at least one photosensitive sensor; and adjusting the light intensity emitted by the at least one OLED element by the at least one compensation adjustment unit on the basis of the light intensity.

For example, the at least one compensation adjustment unit includes a MEMS light valve; the MEMS light valve is provided on a side wall on a light-emitting side of the package structure facing the closed space; and the adjusting of the light intensity emitted by the at least one OLED element includes: determining whether it is needed to perform light compensation to the at least one OLED element according to a detection result of the at least one photosensitive sensor; and moving a light-shielding plate of the MEMS light valve by a position control unit of the MEMS light valve when it is needed to perform a light compensation to the at least one OLED element, so as to improve the light transmittance through the side wall on the light-emitting side of the package structure.

BRIEF DESCRIPTION OF THE DRAWINGS

Embodiments of the present disclosure will be described in more detail below with reference to accompanying drawings to allow an ordinary skill in the art to more clearly understand embodiments of the present disclosure, in which.

DETAILED DESCRIPTION

Hereinafter, technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, a person of ordinary skill in the art can obtain other embodiment(s), without any creative work, which shall be fall within the scope of the disclosure.

The inventor notices that external compensation methods are usually used to solve the problem of the non-uniform and non-stable TFT and different brightness of the OLED devices, so that the brightness of all the pixels can reach an ideal value. The external compensation method of the OLED device can be classified as an optical extraction type and an electrical extraction type according to different data extraction ways. The optical extraction refers to that luminance signals are extracted via charge coupled device (CCD) photooptics after a backplate is lit. Electrical extraction refers to that electrical signals of the TFTs and the OLED device are extracted via a chip-driven sensing circuit. The optical extraction techniques are widely applied due to the advantages of simple structure and flexibility. Inaccurate external compensation and incapability of performing real-time compensation usually happen in OLED devices compensation. It is found after intensive study that the problems are mainly caused by the fact that external compensation is implemented by CCD photography. For instance, the entire panel is captured by a CCD to obtain the brightness of each pixel in several feature grayscales, and subsequently, a modeling is built for the subpixels to obtain a grayscale-brightness characteristic curve of each pixel. In the process of compensating a display image, corresponding compensation grayscale for the subpixel to reach same brightness is reversely deduced from the grayscale-brightness characteristic curve of the subpixel according to the ideal brightness corresponding to an inputted grayscale. A compensation image is obtained by performing similar operations to all of the subpixels. The compensation image is used to drive the backplane to reach the required ideal brightness. However, this technology requires the CCD to accurately capture correct brightness of each pixel and create a correct model, and also requires overcoming problems, such as accurate positioning of the subpixels, and Moire patterns. The above problems affect the accuracy of an external compensation, and the operations are complex. In addition, the inventor also notices that the above technology require the use of specialized equipment, and the equipment can only subject an initializing calibration before leaving the factory. In this way, it is impossible to perform real-time compensation during the product use.

Figure 1:
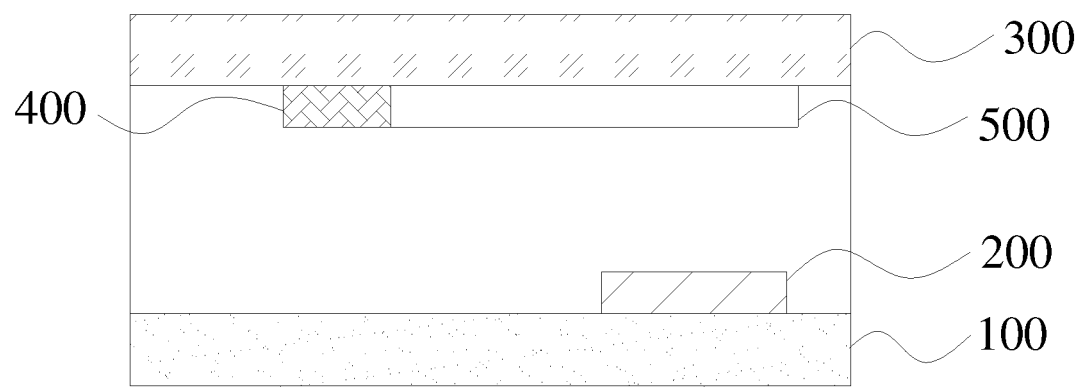
FIG. 1 is a schematically structural view of an OLED device provided by an embodiment of the present disclosure.

An OLED device in an embodiment of the present disclosure, as shown in FIG. 1, comprises: an organic light-emitting diode (OLED) substrate 100, OLED element(s) 200, a package structure 300 and an external compensation component. The OLED element(s) 200 is/are disposed on the OLED substrate 100; a closed space is formed between the package structure 300 and the OLED substrate 100; the external compensation component includes photosensitive sensor(s) 400 and compensation adjustment unit(s) 500; the photosensitive sensor(s) 400 is/are configured to detect the light intensity emitted by the OLED element(s) 200; and the compensation adjustment unit(s) 500 is/are disposed on a side wall on a light-emitting side of the package structure 300 facing the closed space and configured to adjust the light intensity emitted by the OLED device according to the detected signals by the photosensitive sensor(s) 400. In this way, accurate and real time external compensation can be done to the OLED device.

For the convenience of understanding, simple description will be given below to the working principles of the OLED device(s) provided by embodiments of the present disclosure.

As described above, the inventor has noted that: the technology for adopting CCD photography for the external compensation of the OLED device needs to use the CCD to accurately capture correct brightness of each pixel and create a correct model, and also needs to overcome the problems, such as accurate positioning of subpixels, and Moire patterns. In the above technology, firstly, the subpixels must be accurately positioned; secondly, correct brightness of each pixel must be captured; and finally, correct model is created. For external CCD photooptics, it is difficult for accurately positioning the subpixels and capturing the brightness of each pixel, and large error easily occurs in the positioning and capturing, so the accuracy of external compensation can be reduced. In addition, the inventor has noted that the above technology needs the use of specialized equipment, but the equipment can only be subjected to initializing calibration before leaving the factory, so real-time compensation cannot be performed in the product use process. According to embodiments of the present disclosure, the OLED device comprises an external compensation component, namely an external compensation through a built-in structure can be realized. The external compensation component includes photosensitive sensors and compensation adjustment units. The photosensitive sensor(s) can detect the light intensity emitted by the OLED elements. Whether an OLED device requires external compensation, or not, is determined according to a result detected by the photosensitive sensor(s). If external compensation is required, the light intensity emitted by the OLED device is adjusted by applying a voltage to the compensation adjustment units, and finally the required brightness can be reached. As the external compensation component has simple structure and is a built-in structure, accurate compensation and real-time compensation can be realized.

Detailed description will be given below to the structures of the OLED device according to an exemplary embodiment of the present disclosure.

The type of the OLED device is not specifically limited and may be selected and designed by a person of ordinary skill in the art according to conditions. For instance, according to the embodiments of the present disclosure, the OLED device may be a bottom-emission type OLED device, or may be a top-emission type OLED device. Detailed description will be given below to the structures of the OLED device by taking the top-emission type OLED device as an example.

According to an embodiment of the present disclosure, the OLED device comprises a plurality of OLED elements 200. The plurality of OLED elements 200 are arranged on an OLED substrate 100. It is to be understood by a person of ordinary skill in the art that the OLED element 200 may also include structures, such as an anode, a hole transport layer (HTL), an organic emission layer, an electronic transport layer (ETL) and a cathode, and the emission of the OLED element 200 is realized by applying a voltage between the anode and the cathode.

Figure 2:
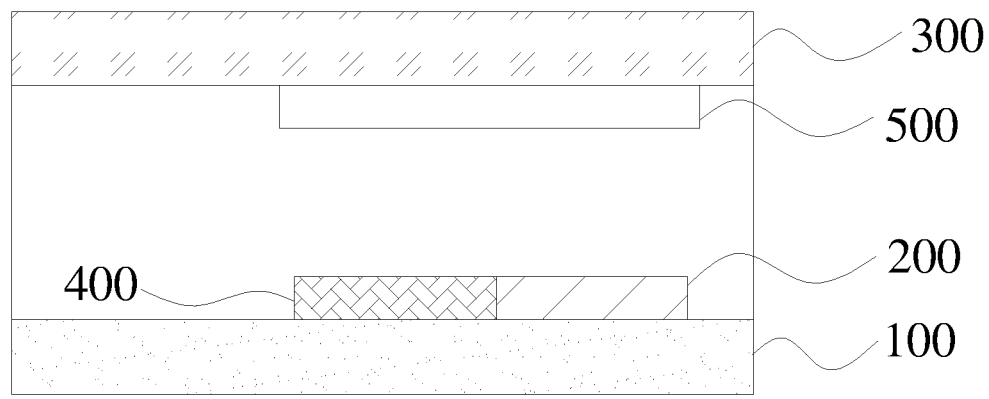
FIG. 2 is a schematically structural view of an OLED device provided by another embodiment of the present disclosure.

According to the embodiment of the present disclosure, the OLED device comprises photosensitive sensors 400. The photosensitive sensor 400 is configured to detect the light intensity emitted by the OLED element 200. In order to detect the light intensity emitted by each OLED element 200, according to an embodiment of the present disclosure, the OLED device may comprise a plurality of photosensitive sensors 400; and the photosensitive sensors 400 may be disposed in opaque/non-transmittance region(s) of the OLED device, so the display of the device will not be affected. The position of each of the photosensitive sensors may be changed but shall not affect the display of the device, and may be designed by a person of ordinary skill in the art according to conditions. For instance, according to an embodiment of the present disclosure, as shown in FIG. 1, the photosensitive sensors 400 may be disposed on a side wall on a light-emitting side of a package structure 300 facing the closed space and corresponding to the opaque regions; or according to some other embodiments of the present disclosure, as shown in FIG. 2, the photosensitive sensors 400 may be disposed on regions on the OLED substrate 100 corresponding to the opaque regions. In this way, the photosensitive sensors may be utilized to detect the light intensity emitted by the OLED element.

Figure 5:
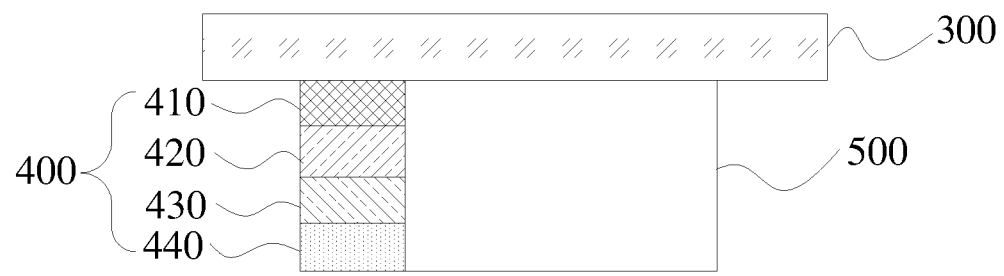
FIG. 5 is a schematically sectional view of a partial structure in FIGS. 4a-4b.
Figure 7:
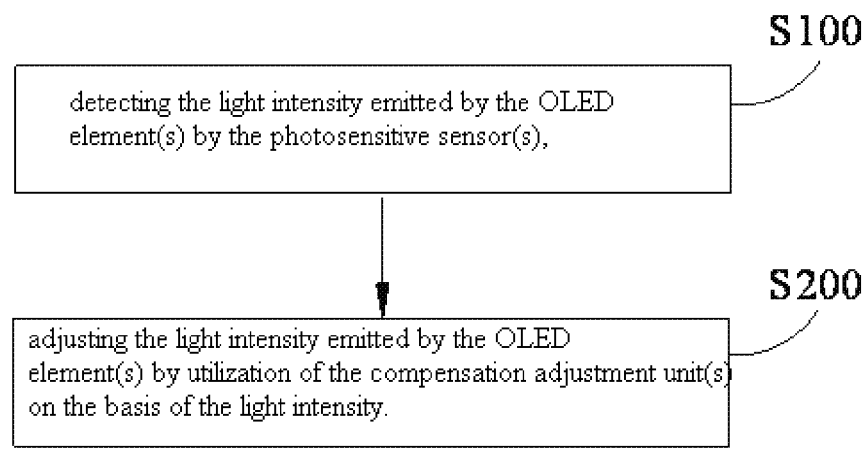
FIG. 7 is a flow chart of a method for adjusting the brightness of an OLED device, provided by an embodiment of the present disclosure.
Figure 8:
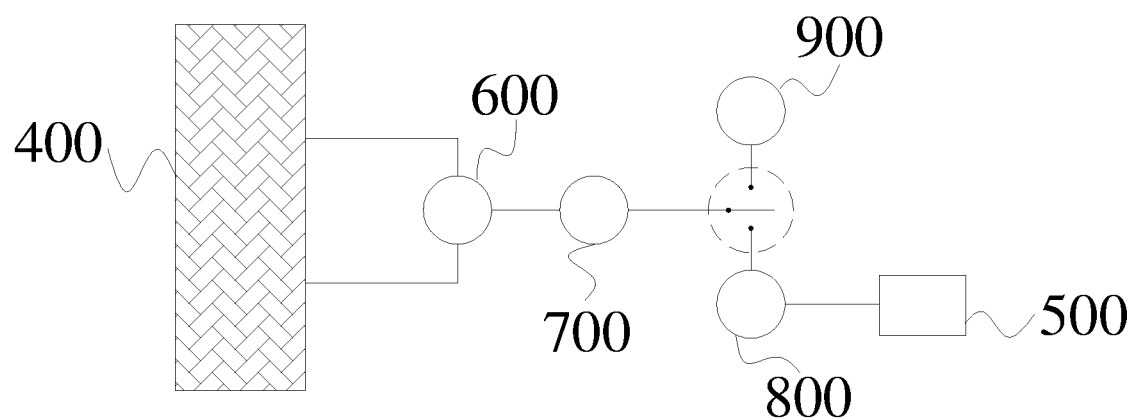
FIG. 8 is a flow chart of a method for adjusting the brightness of an OLED device, provided by another embodiment of the present disclosure.

The materials of the photosensitive sensors may select those capable of realizing the detection of the light intensity emitted by the OLED elements, and may be designed by a person of ordinary skill in the art according to conditions. For instance, according to an embodiment of the present disclosure, the photosensitive sensors 400 may adopt at least one of PN junction or PIN junction. According to an exemplary embodiment of the present disclosure, as shown in FIGS. 5 and 7, when the photosensitive sensor 400 adopts PIN junction, each of the photosensitive sensors 400 includes a metal electrode 410, a P-type semiconductor 420, an N-type semiconductor 430 and a transparent electrode 440. According to the embodiment of the present disclosure, when light is irradiated to the PIN junction, charges are generated on a PIN junction loop, so as to determine the light intensity change of the OLED element 200 detected by the photosensitive sensor by detecting the amount of charges, and the turn-on condition of the compensation adjustment unit 500 is controlled according to the detected result, and real-time optical compensation can be realized.

According to the embodiment of the present disclosure, the OLED device comprises compensation adjustment unit(s). The compensation adjustment unit(s) 500 is/are configured to adjust the light intensity emitted by the OLED device. In order to realize the external compensation of each OLED element 200, according to an embodiment of the present disclosure, the OLED device may comprise a plurality of compensation adjustment units 500. The compensation adjustment units 500 are disposed on the side wall on the light-emitting side of the package structure 300 facing the closed space, and are arranged in one-to-one correspondence with the OLED elements 200. According to the embodiment of the present disclosure, the number of the photosensitive sensors 400 is equal to the number of the compensation adjustment units 500. In this way, each OLED element can obtain accurate external compensation. The circuit connection relationship between the photosensitive sensors 400 and the compensation adjustment units 500 do not affect the display of the device, and may be designed by a person of ordinary skill in the art according to conditions.

Figures 3A, 3B:
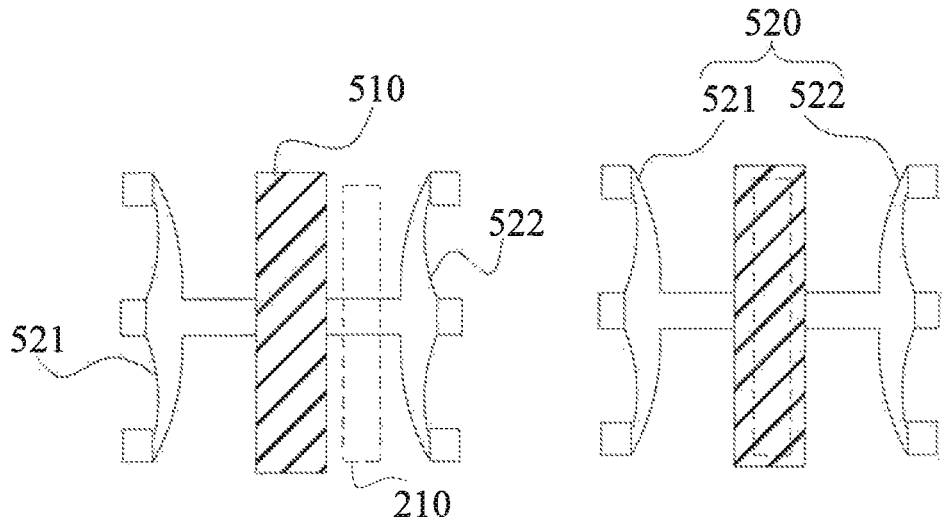
FIG. 3a-3b are schematic diagrams of a MEMS light valve in an embodiment of the present disclosure.

The types of the compensation adjustment units are those capable of realizing accurate compensation and real-time compensation of the OLED device, and may be designed by a person of ordinary skill in the art according to conditions. For instance, according to an embodiment of the present disclosure, the compensation adjustment units 500 may be MEMS light valves. According to the embodiment of the present disclosure, as shown in FIGS. 3a-3b, the MEMS light valve may include: a light-shielding plate 510 and a position control unit 520. The position control unit 520 may include a first flexible driving member 521 and a second flexible driving member 522. The position control unit 520 is configured to control the movement of the light-shielding plate 510, so as to shield at least one part of a luminous region 210 of the OLED element 200, and realize the adjustment of the light intensity emitted by the OLED device. According to the embodiment of the present disclosure, the first flexible driving member 521 and the second flexible driving member 522 are flexible support member capable of being deformed under voltage drive. For instance, in the first flexible driving member 521, a flexible supporting beam is disposed on a side wall close to a side of the light-shielding plate 510, and a flexible driving beam is disposed on a side wall on a side away from the light-shielding plate 510. The flexible driving beam is subjected to deformation expansion under voltage drive, and the light-shielding plate 510 can be driven to move towards a side way from the flexible driving beam. According to the embodiment of the present disclosure, the "on" state of the MEMS light valve is as shown in FIG. 3a, and the "off" state is as shown in FIG. 3b. When the light-shielding plate 510 does not shield the luminous region 210 of the OLED element 200, all the light of the luminous region 210 can be emitted out, namely the MEMS light valve is in the "on" state. When the light-shielding plate 510 completely covers the luminous region 210 of the OLED element 200, all the light of the luminous region 210 is shielded and cannot be emitted, namely the MEMS light valve is in the "off" state. According to the embodiment of the present disclosure, the principles of adjusting the brightness of the OLED device are: determining the required brightness of the OLED device according to the detection result of the photosensitive sensor 400; allowing the light-shielding plate 510 to move towards the direction away from the luminous region 210 if a region of the OLED device requires high brightness, so as to reduce the shielding of the light-shielding plate 510 on the luminous region 210 of the OLED element 200 in the region, and improve the brightness of the region; and allowing the light-shielding plate 510 to move towards the direction of the luminous region 210 if a region of the OLED device requires low brightness, so as to increase the shielding of the light-shielding plate 510 on the luminous region 210 of the OLED element 200 in the region, and reduce the brightness of the region.

Figures 4A, 4B:
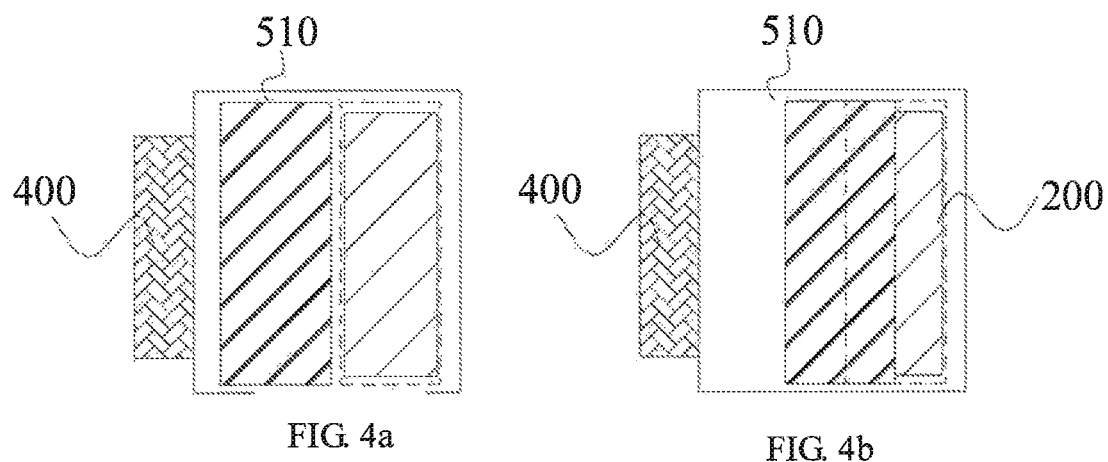
FIG. 4a-4b are schematically structural views of part of the OLED device provided by an embodiment of the present disclosure.

According to an embodiment of the present disclosure, as shown in FIG. 1, when the photosensitive sensor(s) 400 is/are disposed on the side wall on the light-emitting side of the package structure 300 facing the closed space and at position(s) corresponding to the opaque region(s), that is to say, the photosensitive sensor(s) 400 and the MEMS light valve(s) may be arranged side by side. According to the embodiments of the present disclosure, the type of the package structure 300 selects the type capable of realizing the package of the OLED elements 200 and allowing the materials of the emission layers of the OLED elements from being affected by water and oxygen in the environment, and may be designed by a person of ordinary skill in the art according to conditions. For instance, the package structure 300 may include a package cover. The Photosensitive sensor(s) 400 and the MEMS light valve(s) 500 may be disposed on a side of the cover facing the OLED element(s) 20. According to an embodiment of the present disclosure, as shown in FIGS. 4a-4b, the MEMS light valves and the OLED elements 200 are arranged in one-to-one correspondence. For instance, regions in the MEMS light valve, not covered by the light-shielding plate 510, (regions in dotted boxes in the figures), correspond to the OLED elements 200. According to the embodiment of the present disclosure, when the MEMS light valves are in the "on" state, the light transmittance area of the MEMS light valve may be determined according to the light intensity required to be compensated. For instance, according to the embodiment of the present disclosure, as shown in FIG. 4a, when all the light of the OLED element 200 is required to run through the package cover, the light-shielding plate 510 of the MEMS light valve does not shield the OLED element 200. According to some other embodiments of the present disclosure, as shown in FIG. 4b, when partial light of the OLED element 200 is required to run through the package cover, the light-shielding plate 510 of the MEMS light valve partially shields the OLED element 200. According to the embodiment of the present disclosure, the area of the light-shielding plate 510 is greater than or equal to the area of the OLED element 200, so as to realize the overall coverage of the OLED element and improve the preciseness of external compensation. According to the embodiment of the present disclosure, when the photosensitive sensors 400 and the MEMS light valves are arranged side by side, as the light emitted by the OLED elements 200 can be irradiated onto the photosensitive sensors 40, the photosensitive sensors 400 may directly detect the light intensity emitted by the OLED elements 200. According to the embodiment of the present disclosure, as shown in FIG. 5, the photosensitive sensors 400 and the MEMS light valves are arranged side by side; the photosensitive sensor 400 adopts PIN junction; an upper electrode is an opaque metal electrode 410; and a lower electrode is a transparent electrode 440. When the light emitted by the OLED element 200 is irradiated on the PIN junction, charges are generated on a PIN junction loop, so as to determine the light intensity change emitted by corresponding OLED element by detecting the amount of charges.

Figure 6:
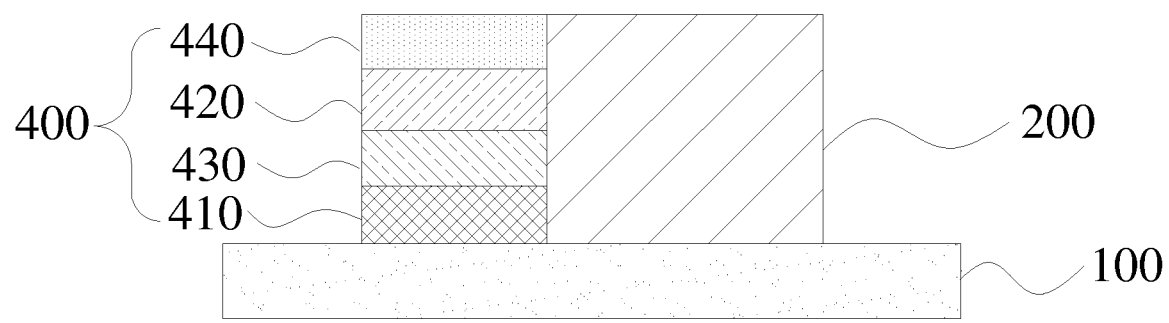
FIG. 6 is a schematically sectional view of a partial structure in FIG. 2.

According to an embodiment of the present disclosure, as shown in FIG. 2, when the photosensitive sensor(s) 400 is/are disposed on the opaque region(s) on the OLED substrate 100, that is to say, the photosensitive sensor(s) 400 and the OLED element(s) 200 may be arranged side by side. According to the embodiment of the present disclosure, as the light emitted by the OLED element(s) cannot be irradiated onto the photosensitive sensor(s) 400, the MEMS light valve(s) is/are required to reflect the light emitted by the OLED element(s) 200 onto the photosensitive sensor(s) 400 (for instance, reflected by utilization of the light-shielding plate 510), so that the photosensitive sensor(s) 400 can detect the light intensity emitted by the OLED element(s) 200. According to an embodiment of the present disclosure, as shown in FIG. 6, the photosensitive sensors 400 and the OLED elements 200 are arranged side by side; the photosensitive sensors 400 adopt PIN junctions; an upper electrode of each photosensitive sensor 400 is a transparent electrode 440, and a lower electrode is an opaque metal electrode 410. When the light emitted by each of the OLED elements 200 is irradiated onto the PIN junction through the MEMS light valve, charges are generated on the PIN junction loop, so as to determine the light intensity change emitted by the corresponding OLED element by detecting the amount of charges.

According to the embodiments of the present disclosure, the OLED device may further comprise at least one of the following units: a detection unit and a current storage unit. The detection unit is connected with each of the plurality of photosensitive sensors and configured to detect the amount of charges generated in the photosensitive sensor. The current storage unit is connected with the plurality of photosensitive sensors. According to the embodiment of the present disclosure, when the photosensitive sensor adopts PIN junction, electrical energy generated in the detection process can be stored into the current storage unit and used by the OLED device. In this way, the photosensitive sensors can be used for detecting the light intensity emitted by the OLED elements and can provide electrical energy for the OLED device.

The embodiments of the present disclosure also provide a display device. According to the embodiments of the present disclosure, the display device comprises the foregoing OLED device. In this way, the display device has the characteristics and advantages of the foregoing OLED device, so no further description will be repeated here. The display device has uniform brightness.

The embodiments of the present disclosure also provide a method for adjusting the brightness of an OLED device. According to the embodiments of the present disclosure, the OLED device may be any of the foregoing OLED devices. In this way, the OLED device have the characteristics and advantages same as those of the foregoing OLED devices, so no further description will be repeated here.

According to an embodiment of the present disclosure, as shown in FIG. 7, the method comprises following operations.

S100: detecting the light intensity emitted by the OLED element(s) by the photosensitive sensor(s).

According to the embodiment of the present disclosure, in the step S100, the photosensitive sensor (s) is/are utilized to detect the light intensity emitted by the OLED element. The material(s) and the position(s) of the photosensitive sensor(s) have been described above in detail, so no further description will be repeated here. For instance, according to the embodiment of the present disclosure, the photosensitive sensor(s) may adopt PIN junction(s) and may also adopt PN junction(s). The photosensitive sensor(s) may be disposed on the side wall on the light-emitting side of the package structure facing the closed space and at position(s) corresponding to the opaque region(s), that is to say, the photosensitive sensor(s) and the compensation adjustment unit(s) may be arranged side by side; or, the photosensitive sensor(s) may be disposed on the opaque region(s) on the OLED substrate, namely the photosensitive sensor(s) and the OLED element(s) may be arranged side by side. According to the embodiment of the present disclosure, when the photosensitive sensor(s) adopt(s) PIN junction(s) and is/are arranged side by side with the compensation adjustment unit(s), the light emitted by the OLED element(s) is/are irradiated to the PIN junction(s), and charges are generated on PIN junction loop(s), so as to determine the light intensity change of corresponding OLED element(s) by detecting the amount of charges. When the photosensitive sensor(s) adopt(s) PIN junction(s) and is/are arranged side by side with the OLED element(s), when the light emitted by the OLED element(s) is irradiated to the PIN junction(s) through the reflection of the MEMS light valve(s), charges are generated on PIN junction loop(s), so as to determine the luminous intensity change of corresponding OLED element(s) by detecting the amount of charges.

S200: adjusting the light intensity emitted by the OLED element(s) by utilization of the compensation adjustment unit(s) on the basis of the light intensity.

According to the embodiment of the present disclosure, in the step S200, the compensation adjustment unit(s) is/are utilized to adjust the light intensity emitted by the OLED device on the basis of the light intensity. Detailed description has been given above to the type of the compensation adjustment unit(s), so no further description will be repeated here. For instance, according to the embodiment of the present disclosure, the compensation adjustment unit(s) may be MEMS light valve(s), and the MEMS light valve(s) is/are disposed on the side wall on the light-emitting side of the package structure facing the closed space. The structure of the MEMS light valves have been described above in detail, so no further description will be repeated here. According to the embodiment of the present disclosure, the process of adjusting the light intensity emitted by the OLED device by utilization of the MEMS light valves is as follows: determining whether it is needed to perform luminous compensation on the OLED device according to the detection results of the photosensitive sensors. When it is necessary to compensate the OLED device, the light transmittance running through the side wall on the light-emitting side of the package structure is adjusted by adoption of position control unit(s) of the MEMS light valve(s) to move light-shielding plate(s) by applying a voltage to the MEMS light valve(s). For instance, according to an exemplary embodiment of the present disclosure, as shown in FIG. 9, the photosensitive sensor(s) 400 will generate a certain amount of charges via light irradiation; the amount of charges generated by the photosensitive sensor(s) is detected through a detection unit 600 and then processed by a data processing unit 700; the brightness required by the OLED device is analyzed; and whether the OLED device requires optical compensation is determined. If the OLED device requires optical compensation, the information is fed back to an external compensation circuit 800, and the external compensation circuit 800 controls the MEMS light valve(s) to adjust the brightness of the OLED device.

According to an exemplary embodiment of the present disclosure, the light intensity emitted by the OLED elements in ideal condition may be obtained according to the type of the OLED elements and the predetermined current, and then the preset position of the light-shielding plates in the MEMS light valves is set according to the predetermined light intensity emitted by the OLED device, for instance, allowing the light-shielding plate to shield partial area of the luminous region. When the brightness detected by the photosensitive sensor(s) is greater than the predetermined light intensity emitted by the OLED device, the light-shielding plate is driven to move towards the luminous region and shield the luminous region, so as to reduce the actual light intensity running through the package cover and achieve display. When the brightness detected by the photosensitive sensor(s) is less than the predetermined light intensity emitted by the OLED device, the light-shielding plate is driven to move towards a side away from the luminous region and expose more area of the luminous region, so as to improve the light intensity running through the package cover. According to the embodiment of the present disclosure, when the detection result indicates that it is not needed to compensate the OLED device, the electrical energy generated by the photosensitive sensors may be stored into a current storage unit 900 and used by the OLED device.

The source of the voltage applied by the MEMS light valves may be designed by a person of ordinary skill in the art according to conditions. For instance, according to the embodiment of the present disclosure, the MEMS light valves may be controlled by external voltage(s). According to some other embodiments of the present disclosure, the MEMS light valves may be controlled by the electrical energy generated by the photosensitive sensors. Therefore, the energy consumption can be reduced.

In the description of the present disclosure, the azimuthal or positional relationships indicated by the terms "on", "under" and the like are based on the azimuthal or positional relationships shown in the accompanying drawings, which are only for facilitating the description of the present disclosure rather than requiring that the present disclosure must be constructed and operated in a specific azimuth, therefore they are not to be construed as limiting the present disclosure. In the description of the present specification, the description of the reference terms "an embodiment", "another embodiment," and the like refer to that feature(s), structure(s), material(s), or characteristics described in the embodiment is included in at least one embodiment of the present disclosure. In this specification, the schematic representation of the above terms does not necessarily have to refer to the same embodiment or example. Moreover, the described features, structures, materials, or characteristics may be combined in any suitable manner in any one or more of the embodiments or examples. In addition, without conflict, different embodiments or examples described in this specification and features of different embodiments or examples may be combined by a person of ordinary skill in the art. Moreover, it should be noted that: in this specification, the terms "first" and "second" are used for describing the purposes only and cannot be construed as indicating or implying the relative importance or implicitly indicating the number of indicated technical features.

Although the embodiments of the present disclosure have been shown and described above, it is to be understood that the above embodiments are exemplary and shall not be construed as the limitation of the present disclosure. Changes, modifications, replacements and deformations may be made to the above embodiments by a person of ordinary skill in the art within the scope of the present disclosure, and such changes, modifications, replacements and deformations shall fall within the scope of the present disclosure.

What is claimed is:

1. An organic light-emitting diode (OLED) device, comprising:
    an OLED substrate provided with at least one OLED element;
    a package structure configured to form a closed space with the OLED substrate; and
    an external compensation component comprising at least one photosensitive sensor and at least one compensation adjustment unit, wherein
    the at least one photosensitive sensor is configured to detect the light intensity emitted by the at least one OLED element; and
    the at least one compensation adjustment unit is provided on a side wall on a light-emitting side of the package structure facing the closed space and configured to adjust light intensity emitted by the at least one OLED element according to a detected signal by the at least one photosensitive sensor.

2. The OLED device according to claim 1, wherein the at least one OLED element is arranged corresponding to the at least one compensation adjustment unit in one-to-one correspondence.

3. The OLED device according to claim 2, wherein the at least one photosensitive sensor is provided in an opaque region of the OLED device; a number of the at least one photosensitive sensor is equal to that of the at least one compensation adjustment unit; and the at least one photosensitive sensor comprises at least one of PN junction or PIN junction.

4. The OLED device according to claim 3, wherein the at least one photosensitive sensor is provided on the side wall on the light-emitting side of the package structure facing the closed space and corresponding to the opaque region; or
   the at least one photosensitive sensor is provided on a region of the OLED substrate corresponding to the opaque region.

5. The OLED device according to claim 2, further comprising at least one of:
   a detection unit connected with each of the at least one photosensitive sensor; and
   a current storage unit connected with the at least one photosensitive sensor.

6. The OLED device according to claim 1, wherein the at least one compensation adjustment unit comprises a microelectro-mechanical system (MEMS) light valve.

7. The OLED device according to claim 6, wherein the MEMS light valve comprises:
   a light-shielding plate and a position control unit, in Which the position control unit is configured to control the movement of the light-shielding plate, so as to shield at least one part of a light-emitting region of the at least one OLED element.

8. A display device, comprising the OLED device according to claim 1.

9. A method for adjusting the brightness of an OLED device, wherein the OLED device comprises an OLED substrate provided with at least one OLED element; a package structure configured to form a closed space with the OLED substrate; and an external compensation component comprising at least one photosensitive sensor and at least one compensation adjustment unit; and the method comprises:
   detecting light intensity emitted by the at least one OLE element by the at least one photosensitive sensor; and
   adjusting the light intensity emitted by the at least one OLED element by the at least one compensation adjustment unit on the basis of the light intensity, the at least one compensation adjustment unit being provided on a side wall on a light-emitting side of the package structure facing the closed space.

10. The method according to claim 9, wherein the at least one compensation adjustment unit comprises a MEMS light valve; the MEMS light valve is provided on a side wall on a light-emitting side of the package structure facing the closed space; and the adjusting of the light intensity emitted by the at least one OLED element comprises:
   determining whether it is needed to perform light compensation to the at least one OLED element according to a detection result of the at least one photosensitive sensor; and
   moving a light-shielding plate of the MEMS light valve by a position control unit of the MEMS light valve when it is needed to perform a light compensation to the at least one OLED element, so as to improve the light transmittance through the side wall on the light-emitting side of the package structure.

* * * * *